United States Patent [19]
Liang et al.

[11] Patent Number: 6,077,762
[45] Date of Patent: Jun. 20, 2000

[54] METHOD AND APPARATUS FOR RAPIDLY DISCHARGING PLASMA ETCHED INTERCONNECT STRUCTURES

[75] Inventors: Victor C. Liang, Milpitas; Subhas Bothra, San Jose; Harlan Lee Sur, Jr., San Leandro, all of Calif.

[73] Assignee: VLSI Technology, Inc., San Jose, Calif.

[21] Appl. No.: 08/995,652

[22] Filed: Dec. 22, 1997

[51] Int. Cl.[7] .............................................. H01L 21/3205
[52] U.S. Cl. ........................ 438/593; 438/694; 438/906; 438/972
[58] Field of Search ................... 438/689, 239, 438/734, 593, 694, 972, 906

[56] References Cited

U.S. PATENT DOCUMENTS

| | | | |
|---|---|---|---|
| 2,303,398 | 12/1942 | Schwartz | 252/135 |
| 3,650,825 | 3/1972 | Lihl | 117/217 |
| 4,012,817 | 3/1977 | Preissinger et al. | 29/25.42 |
| 4,576,884 | 3/1986 | Reisman | 430/30 |
| 4,665,610 | 5/1987 | Barth | 29/580 |
| 4,668,335 | 5/1987 | Mockler et al. | 156/643 |
| 4,873,565 | 10/1989 | Roane | 357/71 |
| 4,879,257 | 11/1989 | Patrick | 437/195 |
| 4,906,586 | 3/1990 | Blackburn | 437/40 |
| 5,024,747 | 6/1991 | Turner et al. | 204/298.09 |
| 5,030,590 | 7/1991 | Amini et al. | 437/233 |
| 5,134,085 | 7/1992 | Gilgen et al. | 437/52 |
| 5,244,534 | 9/1993 | Yu et al. | 156/636 |
| 5,281,320 | 1/1994 | Turner et al. | 204/298.15 |
| 5,281,850 | 1/1994 | Kanamori | 257/758 |
| 5,487,923 | 1/1996 | Min et al. | 427/569 |
| 5,743,000 | 4/1998 | Ekern et al. | 29/623.2 |
| 5,793,105 | 8/1998 | Pace | 257/700 |
| 5,808,210 | 9/1998 | Herb et al. | 73/862.59 |
| 5,849,641 | 12/1999 | Arnett et al. | 438/734 |
| 5,893,756 | 4/1999 | Berman et al. | 438/692 |
| 5,895,239 | 4/1999 | Jeng et al. | 438/239 |
| 5,928,968 | 7/1999 | Bothra et al. | 438/745 |

OTHER PUBLICATIONS

S. Wolf, Ph.D. and R. Tauber, Ph.D., "Silicon Processing for the VLSI Era", vol. 1: Process Technology, Lattice Press, Sunset Beach, CA.

S.T. Cho, K. Najafi, C.L. Lowman and K.D. Wise, "An Ultrasensitive Silicon Pressure–Based Flowmeter", 1989 IEEE, Center for Integrated Sensors and Circuits, Dept. of Electrical Engineering and Computer Science, University of Michigan, Ann Arbor, MI.

*Primary Examiner*—Randy Gulakowski
*Assistant Examiner*—Allan Olsen
*Attorney, Agent, or Firm*—Martine Penilla & Kim, LLP

[57] ABSTRACT

Disclosed is a method for making reliable interconnect structures on a semiconductor substrate having a first dielectric layer. The method includes plasma patterning a first metallization layer that lies over the first dielectric layer. Forming a second dielectric layer over the first metallization layer and the first dielectric layer. Forming a plurality of tungsten plugs in the second dielectric layer, such that each of the plurality of tungsten plugs are in electrical contact with the first metallization layer. Plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer. The method further includes contacting the second metallization layer with a conductive liquid that is electrically grounded. In this manner, the positive charge that is built-up on the at least part of the second metallization layer is neutralized to prevent tungsten plug erosion.

15 Claims, 7 Drawing Sheets

METHOD AND APPARATUS FOR RAPIDLY DISCHARGING PLASMA ETCHED INTERCONNECT STRUCTURES

CROSS REFERENCE TO RELATED APPLICATIONS

This application is related to the following U.S. patent applications: (1) Ser. No. 08/995,650, filed on the same day as the instant application, and entitled "Programmable Semiconductor Structures and Methods for Making the Same"; (2) Ser. No. 08/995,500, filed on the same day as the instant application, and entitled "Semiconductor Pressure Transducer Structures and Methods for Making the Same"; (3) Ser. No. 08/995,679, filed on the same day as the instant application, and entitled "Method and Apparatus for Preventing Electrochemical Erosion of Interconnect Structures"; and (4) Ser. No. 08/995,651, filed on the same day as the instant application, and entitled "Method and Apparatus For Making Reliable Interconnect Structures." These applications are hereby incorporated by reference.

BACKGROUND OF THE INVENTION

1. Field of the Invention

The present invention relates generally to semiconductor circuits and, more particularly, to a method for fabricating reliable interconnect structures in semiconductor integrated circuits.

2. Description of the Related Art

Interconnect structures of integrated circuits (ICs) generally take the form of patterned metallization lines that are used to electrically interconnect devices and to provide interconnection with external circuitry. By way of example, IC devices may include complementary metal oxide semiconductor ("CMOS") devices having diffused source and drain regions that are separated by channel regions, and gates that are located over the channel regions. In practice, an IC chip may include thousands or millions of devices, such as CMOS transistors.

Conventionally, a dielectric layer (e.g., silicon dioxide) is deposited over the devices that are formed on a substrate, and via holes are formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a photoresist via mask, and etching the exposed dielectric layer to form the via holes that lead to a lower level. Once the via holes are formed, a conductive material such as tungsten (W) is used to fill the via holes to define what are known as "tungsten plugs." Once the tungsten plugs are formed, a metallization layer is formed over the dielectric layer and the tungsten plugs. The metallization layer is then patterned using conventional photolithography and plasma etching techniques to define a first level of interconnect metal routing. This process may then be repeated if additional layers of interconnect structures are desired.

To facilitate discussion, FIG. 1 shows a cross-sectional view of a semiconductor substrate 100 having a number of layers fabricated thereon. In this example, the semiconductor substrate 100 has a first dielectric layer 102 deposed over its surface, and a first metallization layer 104 patterned over the first dielectric layer 102. A second dielectric layer 106 is then deposited over the first dielectric layer 102 and the first metallization layer 104. Before a second metallization layer 110 is patterned over the second dielectric layer, via holes are etched and filled with a tungsten material to form tungsten plugs 108. At this point, the second metallization layer 110 is plasma etched to define the desired interconnect lines.

As is well known, conventional plasma etching will cause the semiconductor substrate 100 to be negatively charged, and all metallization features 104/110 and tungsten plugs 108 (i.e., unless they are coupled to the substrate 100) to be positively charged. Once the plasma etching is complete, the substrate 100 is conventionally moved to a basic solution cleaning station where it is submerged in an effort to remove any polymer residues produced during the plasma etching.

Although the basic solution submersing works well in removing the polymer residues, if any one of the tungsten plugs 108 are exposed to the basic solution, the tungsten material will erode away (also known in the art as "corrosion"). As shown in FIG. 1, tungsten plugs 108a are completely covered by the second metallization layer 110, however, a path 120 remains exposing tungsten plug 108b. As mentioned above, because the first metallization layer 104 and the second metallization layer 110 are not coupled to the substrate 100 (i.e., the structure is a floating structure), they will be positively charged and therefore the tungsten plug 108b will erode. If any tungsten plugs 108b erode, the entire IC chip may fail to operate for its intended purpose, thereby driving up fabrication costs.

Because CMOS semiconductor circuits are continuing to decrease in size, and more devices are packed into smaller IC chips, more densely integrated interconnect structures will be required. However, this dense integration has the effect of pushing the limits of conventional photolithography patterning, which necessarily makes photolithography mask misalignments more likely to occur. Of course, when more misalignments occur, more paths 120 will result, thereby increasing the number of exposed tungsten plugs 108b.

In view of the foregoing, there is a need for improved CMOS fabrication techniques that prevent any exposed tungsten plugs from eroding during the basic solvent cleaning operation.

SUMMARY OF THE INVENTION

Broadly speaking, the present invention fills these needs by providing a method that prevents exposed tungsten plugs from eroding during standard CMOS fabrication. It should be appreciated that the present invention can be implemented in numerous ways, including as a process, an apparatus, a system, a device, or a method. Several inventive embodiments of the present invention are described below.

In one embodiment, a method for making reliable interconnect structures on a semiconductor substrate having a first dielectric layer is disclosed. The method includes plasma patterning a first metallization layer that lies over the first dielectric layer. Forming a second dielectric layer over the first metallization layer and the first dielectric layer. Forming a plurality of tungsten plugs in the second dielectric layer, such that each of the plurality of tungsten plugs are in electrical contact with the first metallization layer. Plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer. The method further includes contacting the second metallization layer with a conductive liquid that is electrically grounded. In this manner, the positive charge that is built-up on the at least part of the second metallization layer is neutralized.

In another embodiment, a method for fabricating an interconnect structure on a semiconductor substrate is disclosed. The semiconductor substrate has a first dielectric layer, a first patterned metallization layer, a second dielectric layer over the first patterned metallization layer, and a plurality of tungsten plugs formed in the second dielectric layer. The method includes patterning a second metallization layer that overlies the second dielectric layer and the plurality of tungsten plugs in a plasma etcher. The patterning is configured to leave at least one of the plurality of tungsten plugs not completely covered by the second metallization layer. Further, at least a portion of the second metallization layer, at least one tungsten plug, and at least a portion of the first patterned metallization layer is charged to a positive potential in the plasma etcher. The method further includes contacting an uppermost surface of the semiconductor substrate to a conductive liquid that is electrically grounded so as to neutralize the positive potential. The uppermost surface includes the second metallization layer, the at least one of the plurality of tungsten plugs not completely covered by the second metallization layer after the patterning, and the second dielectric layer.

In yet another embodiment, a fabrication apparatus for manufacturing semiconductor wafers is disclosed. The apparatus includes a processing cluster having a transport chamber. The processing cluster includes a load lock that is connected to the transport chamber and is used to introduce a semiconductor wafer into the processing cluster. A plasma etching chamber is used for etching patterns on the semiconductor wafer, and the semiconductor wafer has at least one floating metallization structure that is charged to a positive potential during the etching of patterns on the semiconductor wafer. The processing cluster further includes a conductive chemical treatment chamber that is configured to receive the semiconductor wafer after the plasma etching chamber. In this manner, the at least one floating metallization structure that is charged to the positive potential is neutralized when the semiconductor wafer is placed in contact with an electrically grounded conductive liquid of the conductive chemical treatment chamber.

One advantage of the present invention is that very reliable interconnect structures can be fabricated without the danger of losing tungsten plugs to erosion (i.e., also known as "corrosion") in a basic solution used to remove post plasma etching polymer residues. Further, the conductive liquid is well suited to rapidly discharge the positive potential of all floating structures in a semiconductor wafer without exposing transistor devices of the semiconductor wafer to gate oxide damage. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention that prevents exposed tungsten plugs from eroding during standard CMOS fabrication is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
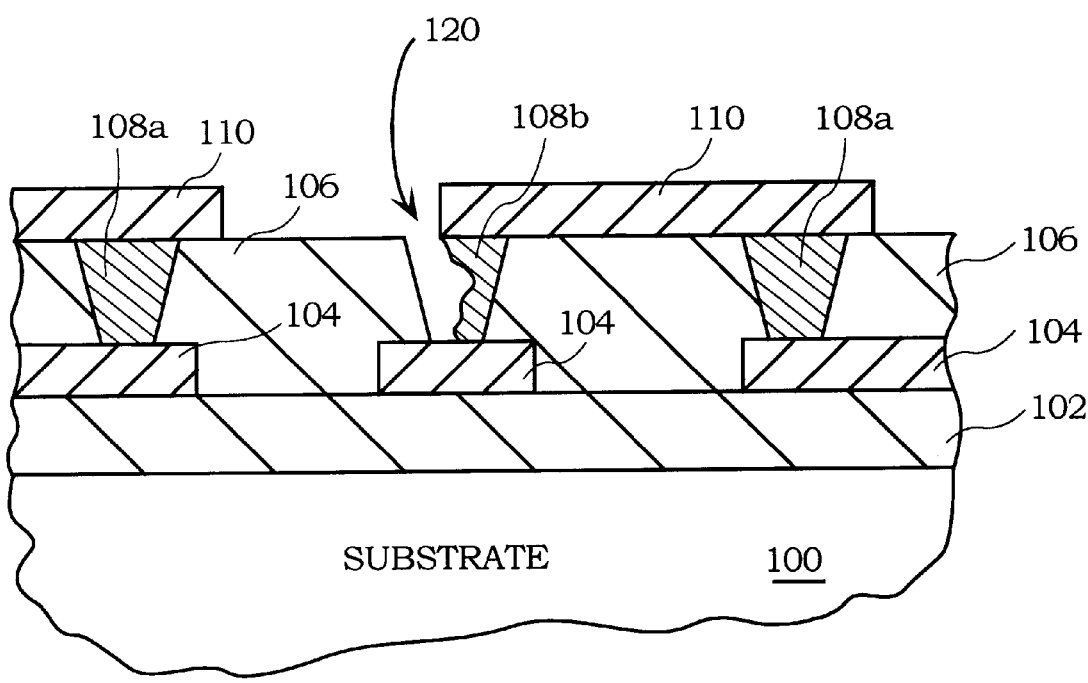
FIG. 1 shows a cross-sectional view of a semiconductor substrate having an eroded tungsten plug.
Figure 2:
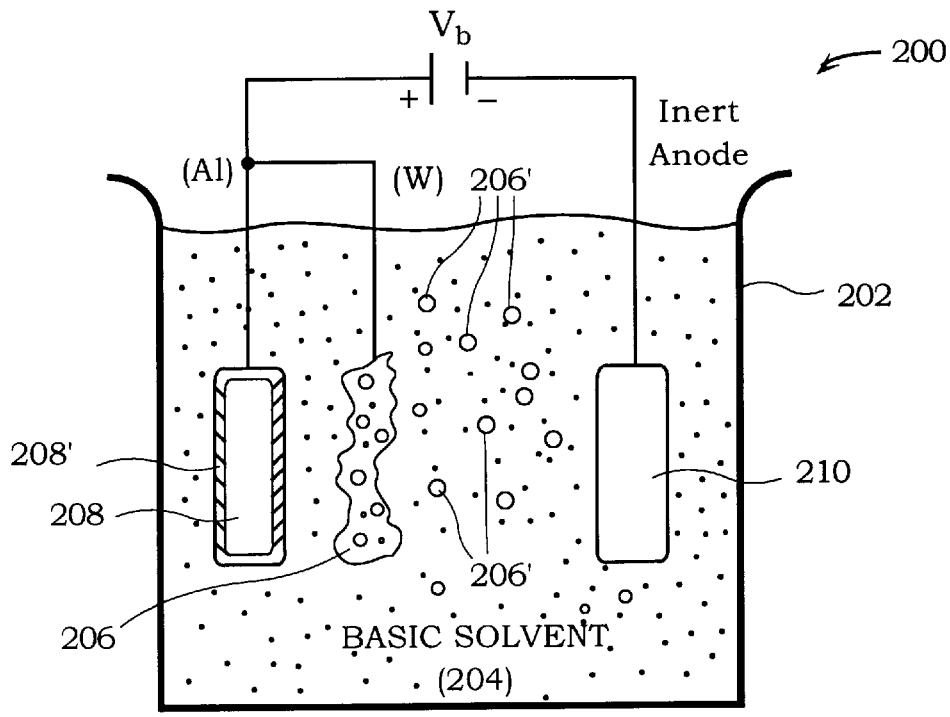
FIG. 2 shows a chemical reaction system having an aluminum electrode and a tungsten electrode submerged in a basic solution in accordance with one embodiment of the present invention.

FIG. 2 shows a chemical reaction system 200 having an aluminum electrode 208 and a tungsten electrode 206 submerged in a basic solution 204 in accordance with one embodiment of the present invention. In this example, both the aluminum electrode 208 and the tungsten electrode 206 are coupled to a positive bias voltage $V_b$, and a negative electrode 210 is coupled to a negative terminal of the bias voltage $V_b$. The basic solvent 204 is preferably an electrolyte that preferably has a pH level that is greater than about 7, and more preferably is greater than about 8, and most preferably is greater than about 10.

Although a chemical reaction between the aluminum electrode 208 and the basic solvent 204, and the tungsten electrode 206 and the basic solvent 204 will naturally occur without the application of a bias voltage $V_b$, the chemical reaction in the basic solvent 204 may be accelerated by applying the bias voltage $V_b$. For example, when the bias voltage $V_b$ is applied between the two electrodes, the tungsten electrode 206 will rapidly begin to erode by reacting with the basic solvent 204. This reaction produces tungsten oxide $WO_2$ 206' which rapidly dissolves in lightly basic solutions. Once the reaction begins, the tungsten will continue to oxidize until the tungsten electrode 206 is completely eroded. In contrast however, the aluminum electrode 208 will not erode in the basic solvent 204, but will form an aluminum oxide passivation layer 208'.

Figure 3A:
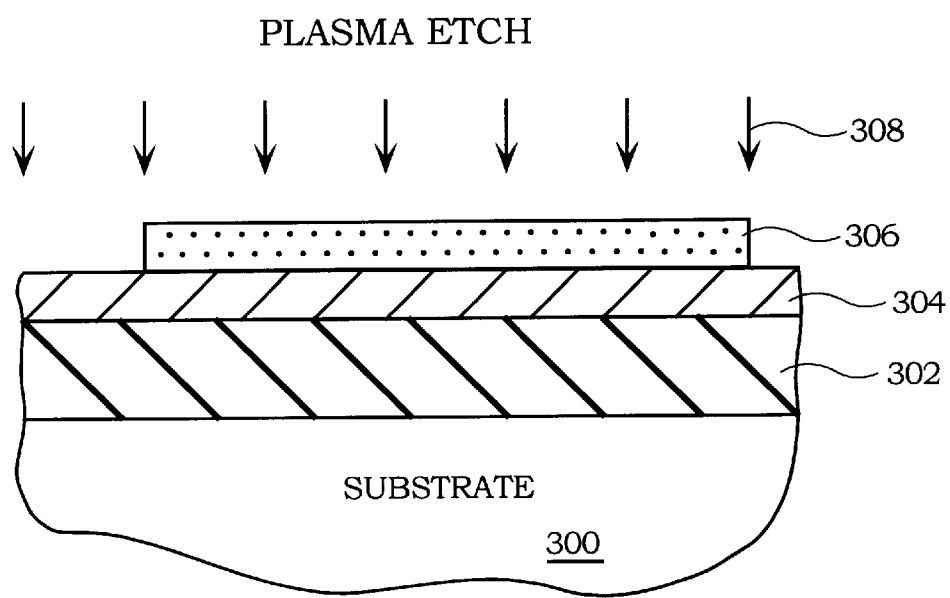
FIG. 3A shows a cross-sectional view of a partially fabricated semiconductor structure that is formed over a substrate in accordance with one embodiment of the present invention.

FIG. 3A shows a cross-sectional view of a partially fabricated semiconductor structure that is formed over a substrate 300 in accordance with one embodiment of the present invention. In an initial operation, an inter-metal oxide 302 is formed over the substrate 300, and then a metallization layer 304 is sputtered over the inter-metal oxide layer 302. In order to pattern the metallization layer 304, a photoresist mask 306 is formed over the metallization layer 304. As is well known, the photoresist mask 306 may be patterned using any number of well known techniques, including conventional photolithography.

Once the photoresist mask 306 has been formed, a plasma etching operation 308 is performed to remove the metallization layer 304 that is not covered by the photoresist mask 306. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 300 to a negative potential (−), and the metallization layers that are not electrically connected to the substrate 300 (i.e., through conductive via structures), to a positive potential (+).

Figure 3B:
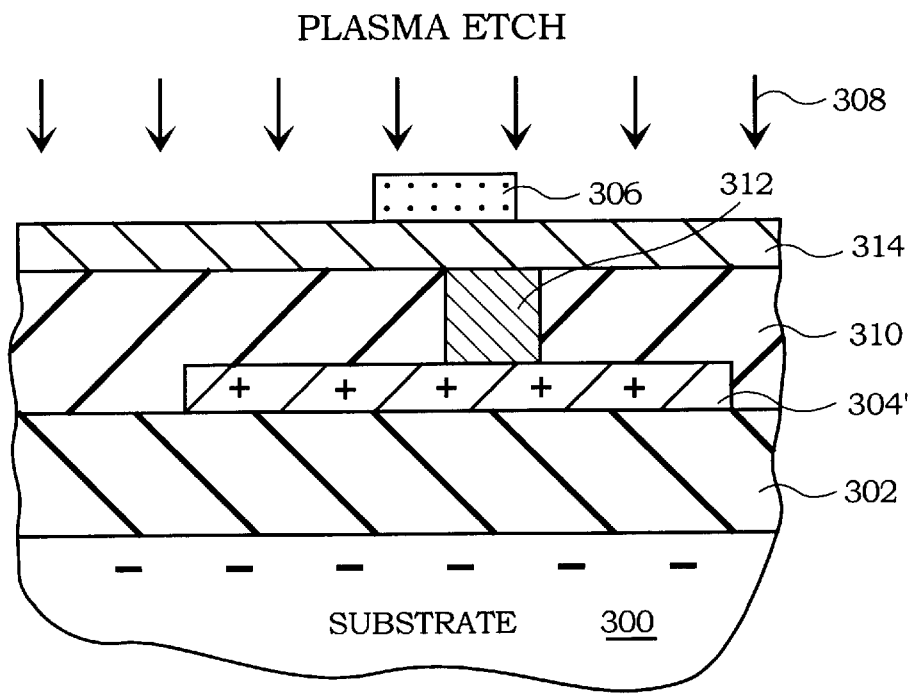
FIG. 3B shows a cross-sectional view of the semiconductor structure of FIG. 3A after a number of layers are fabricated over an inter-metal oxide layer and a patterned metallization layer in accordance with one embodiment of the present invention.

FIG. 3B shows a cross-sectional view of the semiconductor structure of FIG. 3A after a number of layers are fabricated over the inter-metal oxide layer 302 and a patterned metallization layer 304' in accordance with one embodiment of the present invention. As pictorially shown, the patterned metallization layer 304' was charged to a positive (+) potential, and is a floating structure that is not connected to a diffusion or gate of the substrate 300. In this example, an inter-metal oxide layer 310 was formed over the patterned metallization layer 304', and a tungsten plug 312 was formed within a via that was etched into the inter-metal oxide layer 310.

After the tungsten plug 312 is formed into the inter-metal oxide layer 310, a metallization layer 314 is sputtered over the inter-metal oxide layer 310 and the tungsten plug 312. In order to pattern the metallization layer 314, a photoresist mask 306 is patterned over the metallization layer 314. In this example, the photoresist mask 306 may be patterned with an undesirable misalignment such that at least a portion of the tungsten plug 312 is exposed once the metallization layer 314 is etched. Therefore, once the plasma etch operation 308 is performed, the structure of FIG. 3C will result. As shown, a patterned metallization layer 314' will now lie over the inter-metal oxide layer 310, and over substantially all of the tungsten plug 312, except for a gap 320.

Because the plasma etching operations induce a positive charge "Q" (i.e., Q=C*V), that is equivalent to the capacitance "C" of the patterned metallization layers 304' and 314' multiplied by the induced plasma voltage, any misalignment produced gaps 320 will be vulnerable to erosion during submersion in a basic cleaning solution.

Figure 4A:
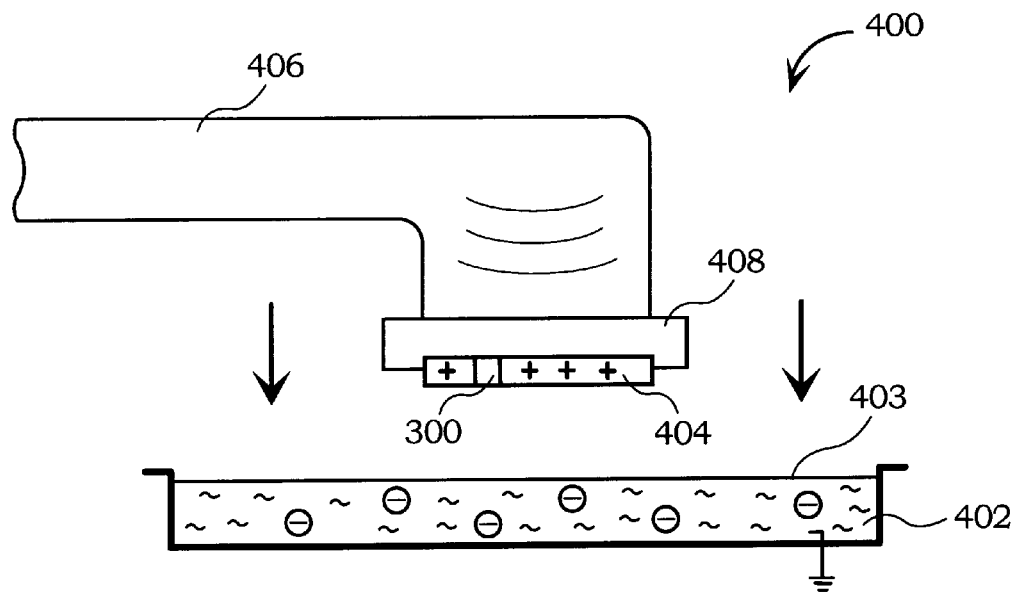
FIG. 4A shows a positive potential discharge system that is used to remove the positive potential of a floating structure in a semiconductor substrate in accordance with one embodiment of the present invention.

FIG. 4A shows a positive potential discharge system 400 that is used to remove the positive potential of any floating structure in the semiconductor substrate 300 in accordance with one embodiment of the present invention. As shown, a mechanical arm 406 having a wafer carrier 408 is used for handling a wafer 404. The mechanical arm 406 is preferably configured to bring the wafer 404, that includes the semiconductor substrate 300, in contact proximity to a conductive liquid 402. The conductive liquid 402 is preferably liquid mercury that is electrically grounded.

The mechanical arm 406 may lower the wafer 404 in contact with the surface 403 of the conductive liquid 402. In this manner, the positive (+) potential of the patterned metallization lines 314', tungsten plug 312, and patterned metallization line 304' of FIG. 3C will be discharged to a neutral potential.

Figure 4B:
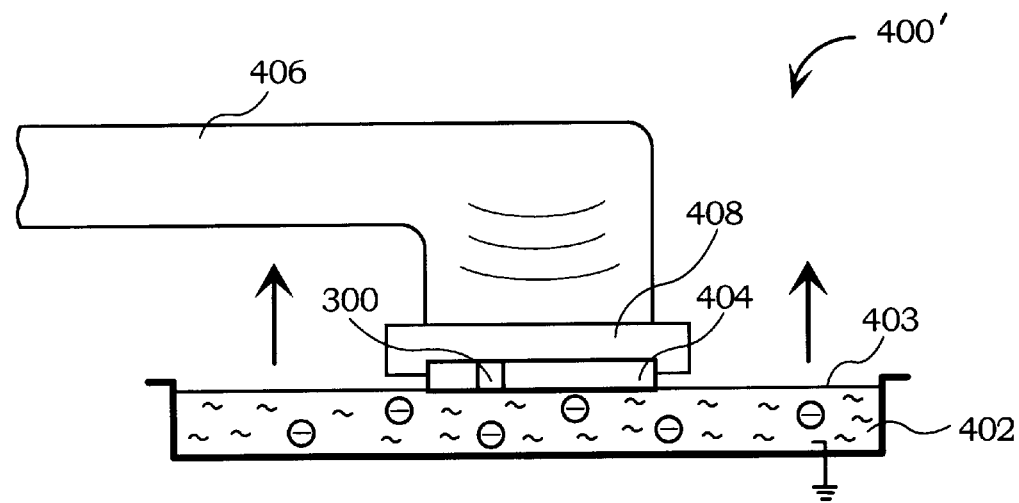
FIG. 4B shows a positive potential discharging system after a mechanical arm and a wafer carrier has lowered the wafer in direct contact with a conductive chemical in accordance with one embodiment of the present invention.

FIG. 4B shows the positive potential discharging system 400 after the mechanical arm 406 and the wafer carrier 408 has lowered the wafer 404 in direct contact with the conductive liquid 402 at the surface 403. Preferably, the conductive liquid 402 will have been electrically grounded so that any positive potential caused by the plasma patterning will be discharged. In one embodiment, the wafer 404 is placed in contact with the surface 403 of the conductive liquid 402 for a period of time that is preferably between about 5 seconds and about 30 seconds. As an advantage, the rapid discharge of positively charged floating structures by the conductive liquid is well suited to prevent gate oxide damage to transistor devices of that may be formed on semiconductor wafer.

Figure 5A:
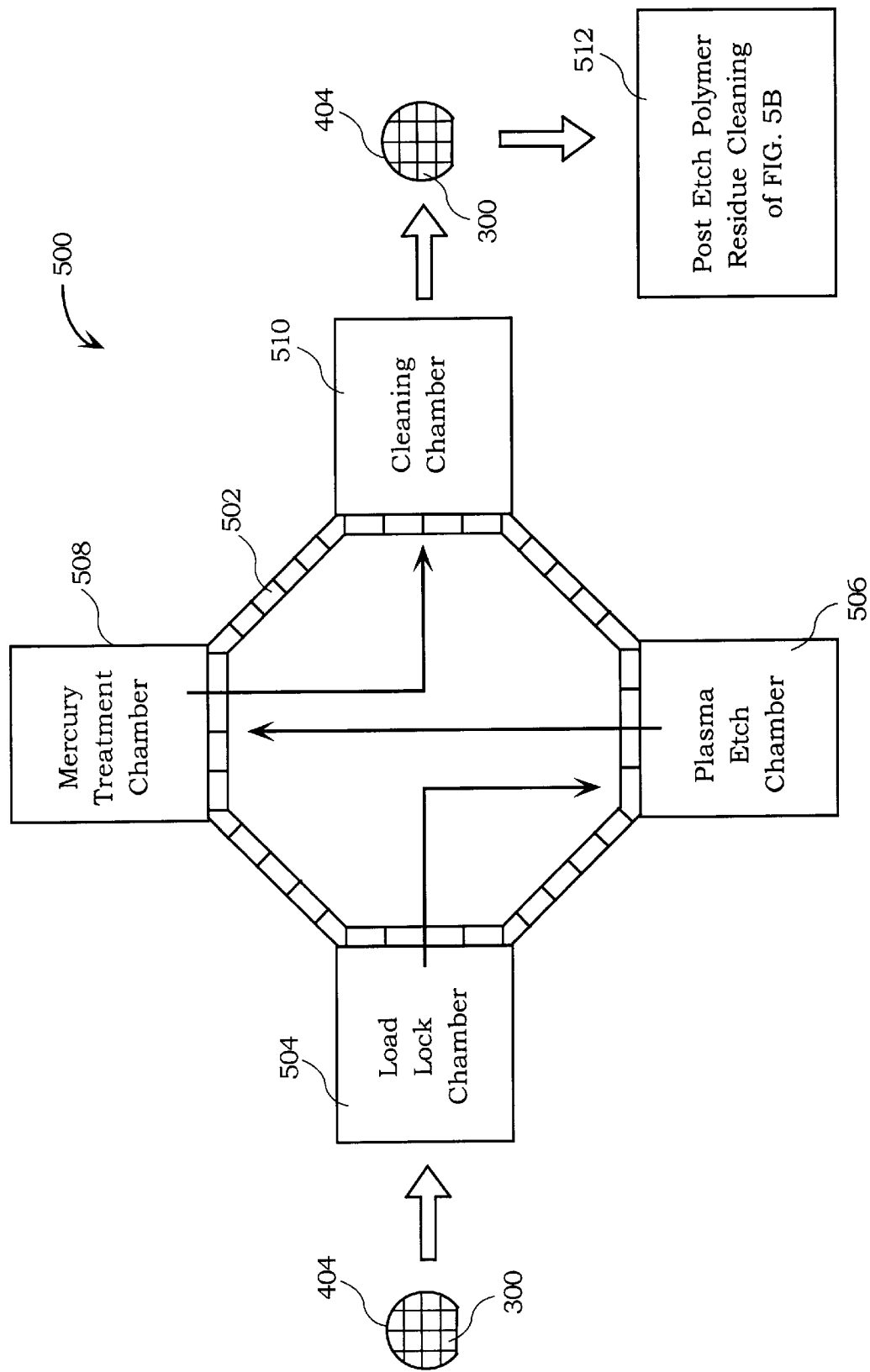
FIG. 5A shows a fabrication system through which a wafer is passed during fabrication in accordance with one embodiment of the present invention.

FIG. 5A shows a fabrication system 500 through which the wafer 404 is passed during fabrication in accordance with one embodiment of the present invention. Initially, the wafer 404 is passed into a load lock chamber 504 during which the pressure is brought down to a suitable processing pressure. Once the pressure is stabilized in the load lock chamber 504, the wafer 404 is passed into a plasma etch chamber 506 via a transport chamber 502.

Figure 3C:
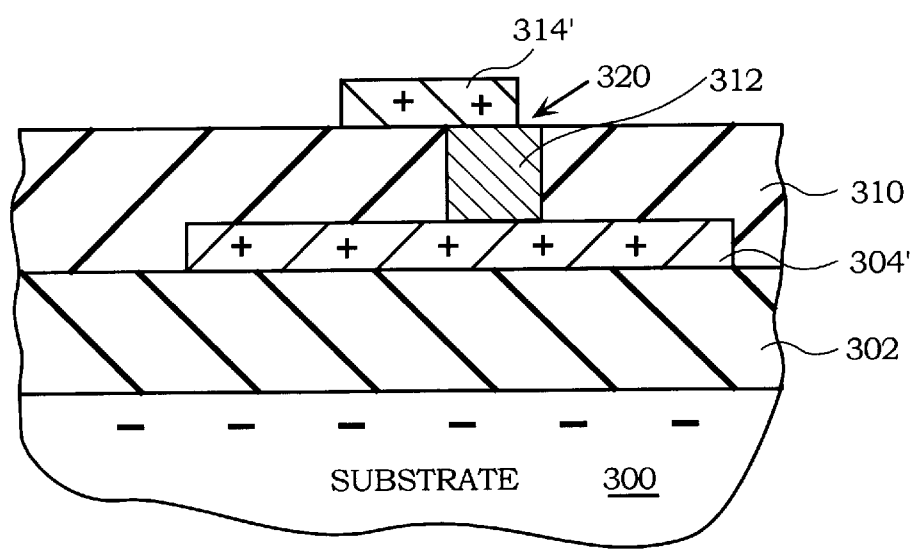
FIG. 3C shows the cross-sectional view of FIG. 3B after a top metallization layer is etched in a plasma etcher in accordance with one embodiment of the present invention.

Typically, the transport chamber 502 includes a robot arm which assists in passing the wafer 404 among the various chambers that are coupled to the transport chamber 502. Once the wafer 404 has been passed into the plasma etch chamber 506, plasma etching is performed to pattern the metallization lines that may be desired for a particular layer (i.e., patterned metallization lines 304'/314'). As mentioned above, during the plasma patterning that is performed in the plasma etch chamber 506, the substrate is charged to a negative potential, and any floating features that are not coupled to the substrate are positively charged as shown in FIG. 3C.

Next, the wafer 404 is removed from the plasma etch chamber 506 and moved into a mercury treatment chamber 508. In mercury treatment chamber 508, the upper surface of the wafer 404 is placed in direct contact with the conductive liquid 402 until any positively charged floating features are discharged by electrically grounding them. Once discharged in the mercury treatment chamber 508, the wafer 404 is transported to a cleaning chamber 510 via the transport chamber 502. In the cleaning chamber 510, any contaminating mercury is removed to avoid contamination to the integrated circuit devices of the wafer 404. The wafer 404 is then removed from the cleaning chamber 510 and sent to a post-etch polymer residue cleaning system 512 of FIG. 5B.

Figure 5B:
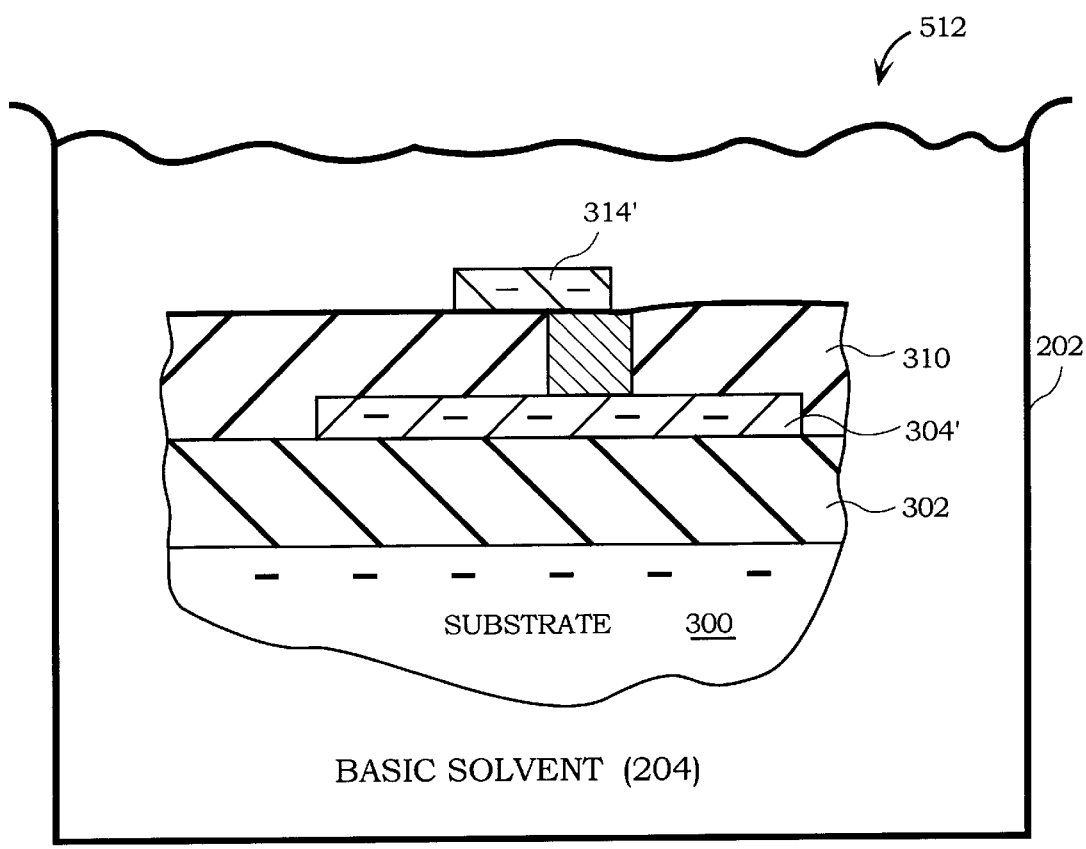
FIG. 5B shows the post-etch polymer residue cleaning system in accordance with one embodiment of the present invention.

FIG. 5B shows the post-etch polymer residue cleaning system 512 in accordance with one embodiment of the present invention. As shown, the substrate 300 and its fabricated layers are submerged in a basic solution 204 in order to remove any polymer residues that are formed during the plasma etching performed in the plasma etch chamber 506 of FIG. 5A. Once the polymer residues have been cleaned off the surface of the fabricated layers of substrate 300, the substrate 300 is removed from the basic solvent 204. Further, as is well known in the art, the post-etch polymer residue cleaning may also include the stripping of any photoresist materials that are used in photolithography processes.

As mentioned above, the basic solution, that has a pH greater than about 7 is used to remove polymer residues that are introduced during plasma etching. Advantageously, because all of the exposed tungsten plugs that are connected to a floating features have now been neutralized, the tungsten plugs 312 will no longer erode in the basic solution. Further, because the tungsten plugs 312 remain intact, the interconnect structures will be more reliable.

Figure 6:
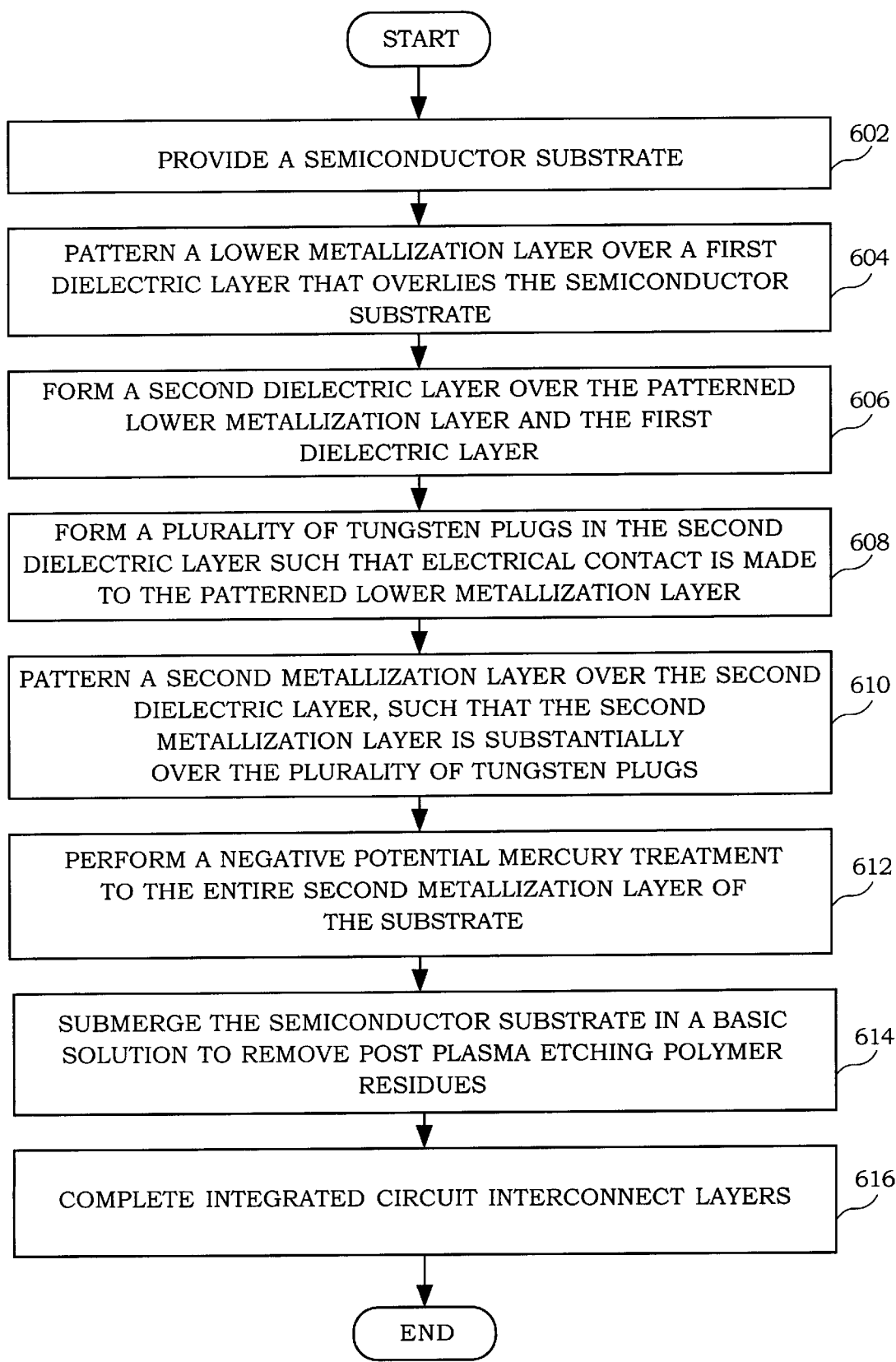
FIG. 6 is a flowchart diagram illustrating the preferred method operations used in fabricating reliable interconnect structures in accordance with one embodiment of the present invention.

FIG. 6 is a flowchart diagram illustrating the preferred method operations used in fabricating reliable interconnect structures in accordance with one embodiment of the present invention. The method begins at an operation 602 where a semiconductor substrate is provided. In general, the semiconductor substrate may be any substrate that may benefit from reliable tungsten plugs that are used in interconnect structures. The method then proceeds to an operation 604 where a lower metallization layer is patterned over a first dielectric layer that overlies the semiconductor substrate. Once the lower metallization layer has been patterned, the method will proceed to an operation 606 where a second dielectric layer is formed over the patterned lower metallization layer and the first dielectric layer. After the second dielectric layer has been formed, the method will proceed to an operation 608.

In operation 608, a plurality of tungsten plugs are formed into the second dielectric layer such that electrical contact is made with the patterned lower metallization layer. Next, a second metallization layer is patterned over the second dielectric layer, such that the second metallization layer is substantially over the plurality of tungsten plugs. Of course, it is a general intention that the tungsten plugs be completely covered by an overlying metallization line, however, photolithography misalignments tend to prevent perfect overlaps.

The method will then proceed to an operation 612 where a negative potential mercury treatment to the entire second metallization layer of the substrate is performed (that includes any floating structures). As shown in FIGS. 4A through 5A, a wafer having a plurality of substrates in an un-partitioned state are placed in direct contact with a mercury liquid that has been electrically grounded. Once subjected to the mercury treatment, the semiconductor wafer is cleaned to remove any mercury contamination.

The method will now proceed to an operation 614 where the semiconductor substrate is submerged in a basic solution to remove post plasma etching polymer residues. The method will then proceed to an operation 616 where the remaining integrated circuit interconnect layers are completed, and the method will end. It should be understood that although reliable interconnect structures were described with regard to the first two metallization layers, the above described embodiments are equally applicable to other metallization layers.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making reliable interconnect structures on a semiconductor substrate having a first dielectric layer, comprising:

plasma patterning a first metallization layer over the first dielectric layer;

forming a second dielectric layer over the first metallization layer and the first dielectric layer, forming a plurality of tungsten plugs in the second dielectric layer, such that each of the plurality of tungsten plugs is in electrical contact with the first metallization layer;

plasma patterning a second metallization layer over the second dielectric layer and the plurality of tungsten plugs, such that at least one of the tungsten plugs is not completely covered by the second metallization layer and a positive charge is built-up on at least part of the second metallization layer; and contacting the second metallization layer with a liquid metal that is electrically grounded so that the positive charge that is built-up on the at least part of the second metallization layer is neutralized.

2. A method for making reliable interconnect structures as recited in claim 1, further comprising:

cleaning the liquid metal from the second metallization layer to remove any contamination induced by the liquid metal.

3. A method for making reliable interconnect structures as recited in claim 2, her comprising:

submersing the semiconductor substrate into a basic solution to remove plasma patterning polymer residues after the cleaning of the liquid metal.

4. A method for making reliable interconnect structures as recited in claim 3, wherein the liquid metal is mercury.

5. A method for making reliable interconnect structures as recited in claim 3, wherein the basic solution has a pH level that is greater than 7.

6. A method for making reliable interconnect structures as recited in claim 4, wherein a wafer is provided with the semiconductor substrate, further comprising:

handling the wafer with a mechanical arm to contact the second metallization layer with the liquid metal.

7. A method for making reliable interconnect structures as recited in claim 6, further comprising:

lowering the wafer using the mechanical arm into the liquid mercury until the positive charge is neutralized.

8. A method for making reliable interconnect structures as recited in claim 7, wherein the mechanical arm is contained within a mercury treatment chamber.

9. A method for fabricating an interconnect structure on a semiconductor substrate that has a first dielectric layer, a first patterned metallization layer, a second dielectric layer over the first patterned metallization layer, and a plurality of tungsten plugs formed in the second dielectric layer, the method comprising:

patterning a second metallization layer that overlies the second dielectric layer and the plurality of tungsten plugs in a plasma etcher, such that the patterning leaves at least one of the plurality of tungsten plugs not completely covered by the second metallization layer, and at least a portion of the second metallization layer, at least one tungsten plug and at least a portion of the first patterned metallization layer is charged to a positive potential; and contacting an uppermost surface of the semiconductor substrate to a liquid metal that is electrically grounded so as to neutralize the positive potential, the uppermost surface includes the second metallization layer, the at least one of the plurality of tungsten plugs not completely covered by the second metallization layer after the patterning, and the second dielectric layer.

10. A method for fabricating an interconnect structure on a semiconductor substrate as recited in claim 9, further comprising:

cleaning the uppermost surface of the semiconductor substrate to substantially remove the liquid metal, one of the plurality of tungsten plugs from eroding in the basic cleaning solution.

11. A method for fabricating an interconnect structure on a semiconductor substrate as recited in claim 10, further comprising:

submersing the semiconductor substrate into a basic cleaning solution after the cleaning, and the neutralization of the positive potential prevents the at least one of the plurality of tungsten plugs from eroding in the basic cleaning solution.

12. A method for fabricating an interconnect structure on a semiconductor substrate as recited in claim 11, wherein the liquid metal is mercury.

13. A method for fabricating an interconnect structure on a semiconductor substrate as recited in claim 12, wherein the basic cleaning solution has a pH that is greater than 7.

14. A method for fabricating an interconnect structure on a semiconductor substrate as recited in claim 9, wherein a wafer is provided with the semiconductor substrate, further comprising:

handling the wafer with a mechanical arm to contact the uppermost surface of the semiconductor substrate with the liquid metal.

15. A method for fabricating an interconnect structure on a semiconductor substrate as recited in claim 14, wherein the mechanical arm is contained within a mercury treatment chamber.

* * * * *